(12) United States Patent
Allen et al.

(10) Patent No.: US 7,818,694 B2
(45) Date of Patent: Oct. 19, 2010

(54) IC LAYOUT OPTIMIZATION TO IMPROVE YIELD

(75) Inventors: Robert J Allen, Jericho, VT (US); Faye D Baker, Burlington, VT (US); Albert M Chu, Essex, VT (US); Michael S Gray, Fairfax, VT (US); Jason Hibbeler, Williston, VT (US); Daniel N Maynard, Craftsbury Common, VT (US); Mervyn Y Tan, Milton, VT (US); Robert F Walker, St. George, VT (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 12/342,353

(22) Filed: Dec. 23, 2008

(65) Prior Publication Data

US 2009/0100386 A1    Apr. 16, 2009

Related U.S. Application Data

(62) Division of application No. 11/424,922, filed on Jun. 19, 2006, now Pat. No. 7,503,020.

(51) Int. Cl.
*G06F 17/50* (2006.01)
(52) U.S. Cl. .............................. 716/2; 716/5
(58) Field of Classification Search ........................ None
See application file for complete search history.

(56) References Cited

U.S. PATENT DOCUMENTS

| | | | |
|---|---|---|---|
| 6,178,539 B1 | 1/2001 | Papadopoulou | |
| 6,240,541 B1 * | 5/2001 | Yasuda et al. | 716/6 |
| 6,317,859 B1 | 11/2001 | Papadopoulou et al. | |
| 6,834,375 B1 | 12/2004 | Stine et al. | |
| 6,918,101 B1 | 7/2005 | Satya et al. | |
| 6,948,141 B1 | 9/2005 | Satya et al. | |
| 6,986,109 B2 * | 1/2006 | Allen et al. | 716/2 |
| 7,055,113 B2 * | 5/2006 | Broberg et al. | 716/1 |
| 7,260,790 B2 | 8/2007 | Allen et al. | |
| 7,313,508 B2 * | 12/2007 | Croffie et al. | 703/14 |
| 7,318,214 B1 * | 1/2008 | Prasad et al. | 716/21 |
| 7,356,784 B1 * | 4/2008 | Dengi et al. | 716/2 |
| 7,512,921 B2 * | 3/2009 | Shibuya | 716/9 |

(Continued)

OTHER PUBLICATIONS

Youcef Bourai and C.-J. Richard Shi, Layout Compaction for Yield Optimization via Critical Area Minimization, Design Automation and Test in Europe (Date '00), 4 pages.

(Continued)

*Primary Examiner*—Leigh Marie Garbowski
(74) *Attorney, Agent, or Firm*—Gibb I.P. Law Firm, LLC; Richard M. Kotulak, Esq.

(57) ABSTRACT

Optimizing an integrated circuit design to improve manufacturing yield using manufacturing data and algorithms to identify areas with high probability of failures, i.e. critical areas. The process further changes the layout of the circuit design to reduce critical area thereby reducing the probability of a fault occurring during manufacturing. Methods of identifying critical area include common run, geometry mapping, and Voronoi diagrams. Optimization includes but is not limited to incremental movement and adjustment of shape dimensions until optimization objectives are achieved and critical area is reduced.

20 Claims, 11 Drawing Sheets

U.S. PATENT DOCUMENTS

| | | |
|---|---|---|
| 2004/0128641 A1 | 7/2004 | Broberg, III et al. |
| 2004/0230922 A1 | 11/2004 | Allen |
| 2004/0230938 A1 | 11/2004 | Sharpe et al. |
| 2005/0108669 A1 | 5/2005 | Shibuya |
| 2005/0251771 A1* | 11/2005 | Robles .......................... 716/5 |

OTHER PUBLICATIONS

Allen et al, U.S. Appl. No. 11/424,922, Office Action Communication, Aug. 21, 2008, 12 pages.

Notice of Allowance, U.S. Appl. No. 11/424,922, Oct. 30, 2008.

* cited by examiner

IC LAYOUT OPTIMIZATION TO IMPROVE YIELD

CROSS REFERENCE TO RELATED APPLICATION

This Application is a divisional of U.S. patent application Ser. No. 11/424,922, filed Jun. 19, 2006 now U.S. Pat. No. 7,503,020 and assigned to the present Assignee.

BACKGROUND OF THE INVENTION

1. Field of the Invention

The present invention relates to a service for optimizing VLSI circuit designs using manufacturing data and various algorithms to ensure better yields in IC manufacturing.

2. Background of the Invention

The critical area of a very large scale integration (VLSI) layout is a measure that reflects the sensitivity of the layout to random defects that are introduced during the manufacturing process. Critical area is widely used to predict the yield of a VLSI chip. Yield prediction is essential in today's VLSI manufacturing due to the growing need to control cost. One model for yield estimation is based on the concept of critical area, which represents the main computational problem in the analysis of yield loss due to random (spot) defects during fabrication. Spot defects are caused by particles such as dust and other contaminants in materials and equipment and are classified into two types: "extra material" defects causing shorts between different conducting regions and "missing material" defects causing open circuits.

Therefore, it is an object of the invention to provide a means of automatically identifying and analyzing critical areas of an IC circuit layout during the design phase, and reducing the probability of defects by modifying the design. The automated design modification will improve the yields in manufacturing by reducing the probabilities of failures from contaminants or impurities, without creating new design problems. In other words, the method provides constrained optimization.

SUMMARY OF THE INVENTION

An embodiment of the invention provides a service for optimizing a VLSI layout using critical area information, design methodology rules, manufacturing ground rules, manufacturing process data, and automation. Starting with an initial integrated circuit physical design, the invention associates variables with the positions of the edges of shapes in the design. The invention determines the critical area contribution cost using the variables. Critical area contributions comprise a measure of electrical fault characteristics of the spacing between edges and represent the probability of a fault occurring during manufacturing. The invention optimizes the position and dimensions of the edges to reduce critical area contribution cost in an iterative method in a first direction across the integrated circuit design to produce a revised integrated circuit design. The invention optionally repeats this process with the revised integrated circuit design in a second direction to further reduce critical area contribution cost, and then optionally repeats the optimization in the first dimension and second dimension depending on whether the critical area of the layout can be further reduced.

Unlike existing yield optimization methods, the method of the present invention uses real manufacturing data to identify where possible failures will occur during the manufacturing process. Each failure type is given a weight according to the likelihood that it will adversely affect yield. This information is fed into the optimization algorithm. The method uses critical area analysis (CAA) techniques to identify critical areas in the design including Voronoi diagrams, common-run calculations, and Monte Carlo simulations. Other known algorithms such as genetic algorithms, neural networks, and statistical analysis methods could also be used. Once critical areas have been identified and weighted, the method alleviates the impact of the critical areas by using several techniques. For example, shape modification of a structure, and moving the location of structures within the design.

To minimize the use of available resources and speed the design process, the method focuses on higher weighted failures when more than one failure is possible in a given area and mitigates those critical area risks. The design optimization process eliminates the need for making a trade-off between alleviating critical failures and available design time and resources because it takes the same amount of time to fix all of the identified critical areas that have been identified from the manufacturing data.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

DESCRIPTION OF THE INVENTION

This invention discloses three embodiments for identifying critical area in VLSI circuits. Although, it would be recognized by one skilled in the art that other embodiments involving formulas, variables, and algorithms could be used. A first embodiment describes a method of using a first-order approximation to the critical area between two parallel outside layout shape edges. A second embodiment describes a method of using Voronoi diagrams to identify and prioritize critical area between edges of arbitrary orientation and position. A third embodiment of the present invention uses a non-Voronoi CAA tool that has the capability of showing critical area values in specific locations of the layout. The invention further includes a method of reducing the critical area identified by any of the methods described herein, thereby reducing the probability of defects during manufacturing, thus increasing yield. Note: the term "structure" is sometimes referred to and is synonymous with the term "shape" within the context of this specification. A structure or shape has an inherent geometry associated with it.

Figure 1:
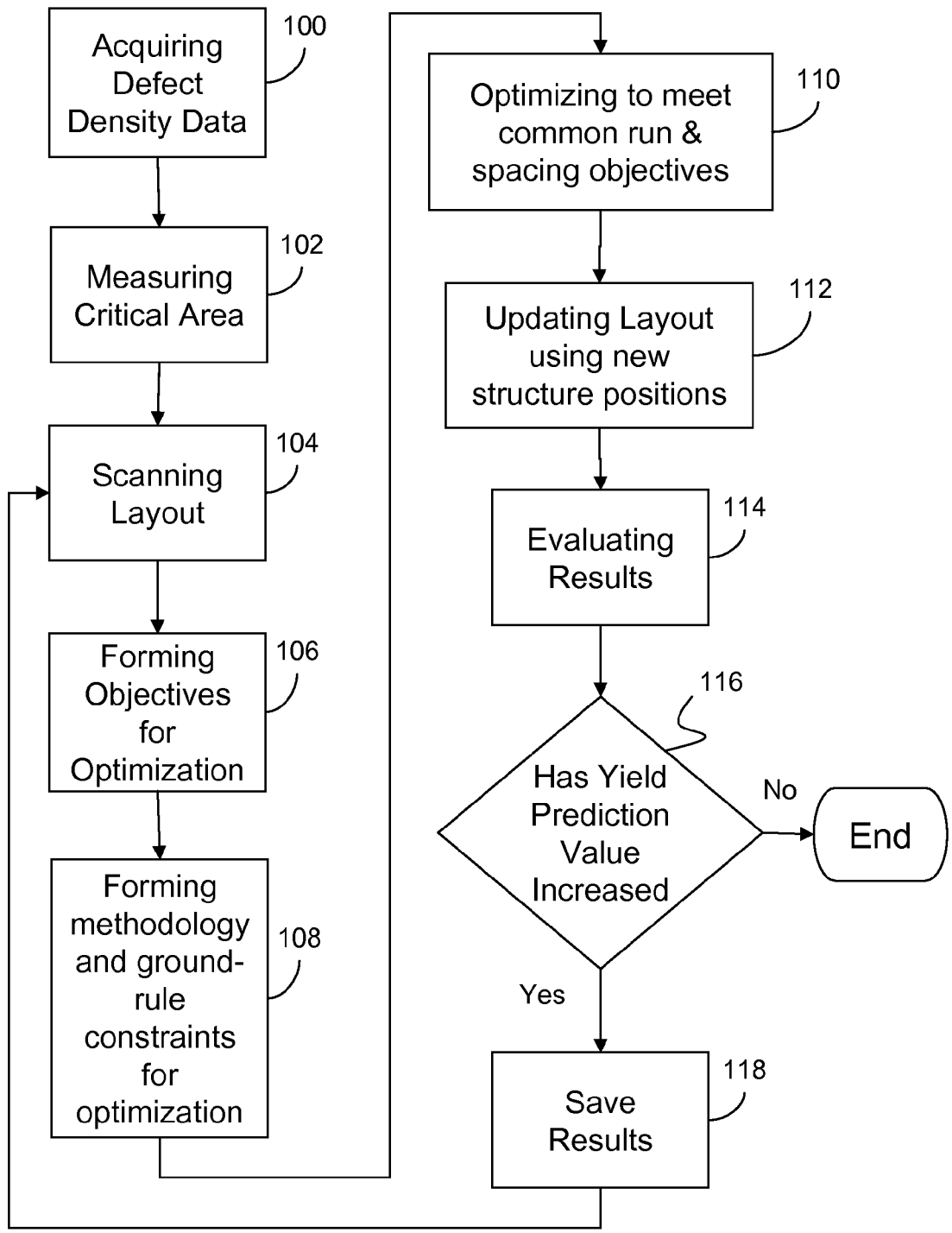
FIG. 1 is a flow diagram of a circuit optimization method using common run analysis.

FIG. 1 illustrates the method of a first embodiment, which identifies critical area in an IC layout using common run. In step 100, the method acquires defect density data provided by the manufacturing process. This data gives the estimated fault density for various defect mechanisms (e.g., short-circuit-causing faults on layer M1) and provides the input for step 102. In step 102 the method measures critical area based on the defect data.

In step 104, for a given layout, the method scans the layout and records L/S for each shape in the design, where L is the common run between adjacent parallel edges and S is the distance between the edges. The method compares the recorded information to the defect density data to identify critical areas and further, identify the critical areas with the higher probability of failures. The weight assigned to each of these critical areas is the product of L/S and a layer-specific constant for shorts, opens, random defects, or combinations of faults, depending on whether the method is manipulating edges in the same unioned shape (e.g. to treat opens) or in two different unioned shapes (e.g. to treat shorts). These fault constants represent the relative incidence of faults in that layer, for the type of defect in question, in the manufacturing line.

In step 106, the method builds a set of piecewise-linear pair-wise objectives in one direction (e.g. vertically, horizontally) called the optimization direction, within the critical areas identified in step 104. For each pair of facing edges, the method builds a linear objective that attempts to move the edges apart (for edges perpendicular to the optimization direction) or reduce the distance over which the edges face each other (for edges parallel to the optimization direction). The method also assigns a weight to the objectives based on the layer being evaluated and whether the edges in question are in the same unioned shape (i.e. for opens) or are in a different unioned shapes (i.e. for shorts).

In step 108, the method forms methodology and ground rule constraints for optimization. The method places limits on how far apart or how close together edges for each shape can be moved and the dimensions certain shapes can tolerate based on ground rules and topological constraints. For example, in certain design methodologies, a structure near the boundary cannot be moved outside the boundary or perhaps closer than a specified distance to the boundary. Also, a structure cannot be allowed to widen to the point where it connects to a neighboring shape. In addition, the method creates constraints, which ensure that the modified circuit obeys timing and logic requirements.

In step 110, the method optimizes the design to meet common run and spacing objectives identified in step 106. For example, moving edges reduces the opens critical area of a horizontal rectangular shape either by making the rectangle shorter, thereby reducing L, or by making it wider thereby increasing S. Reducing the shorts critical area between two facing vertical edges of different shapes is accomplished by reducing the common run thereby reducing L, or by moving the edges further apart thereby increasing S.

In step 112, the method modifies the placement and/or shapes of the design according to the optimization results from step 110, updating the layout using the new structure positions. The distance the edges are moved apart to reduce the common run is a small value, e.g. a few steps in the manufacturing grid. By restricting the change to any one edge to a small amount in any optimization step, the method allows new relationships caused by the relative movement of edges to be discovered and optimized during the next subsequent optimization run.

Figure 2A:
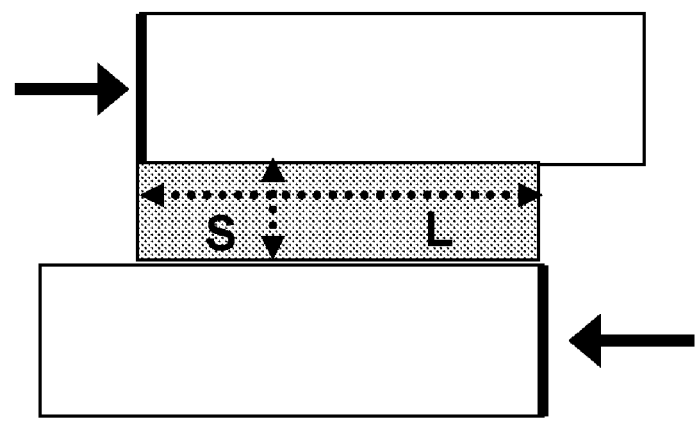
FIGS. 2a and 2b are examples of circuit optimization using common run objectives between structures.
Figure 2B:
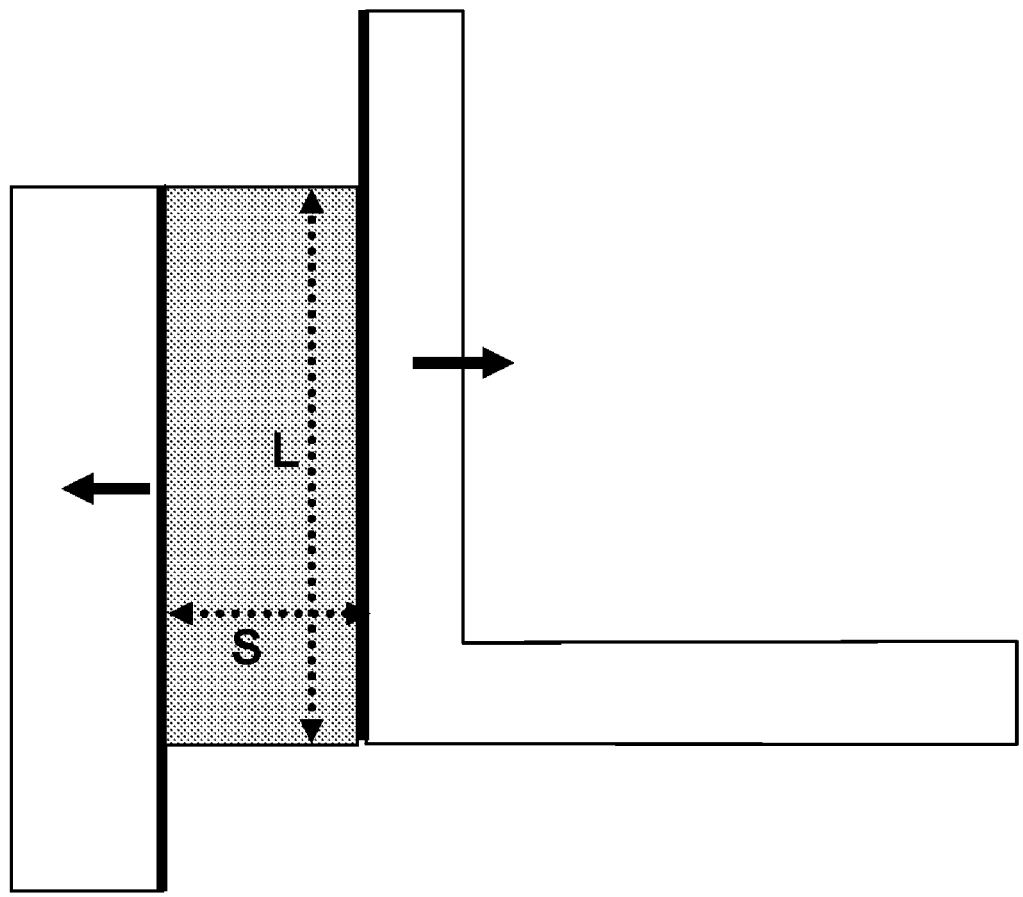

FIG. 2 illustrates an example of changing shape locations and/or geometries to reduce common run. FIG. 2a shows the possible new positions of shape edges such that L is effectively reduced. FIG. 2b shows a movement possibility that increases S. In sum, the common run of two parallel edges is the distance over which they run parallel to each other. In general, the probability of failure increases as the common run between two edges becomes larger, and/or the distance between any two edges becomes smaller. Therefore, the probability of failure decreases as the quantity L/S is reduced, which can be done by decreasing L and/or by increasing S.

Figure 3A:
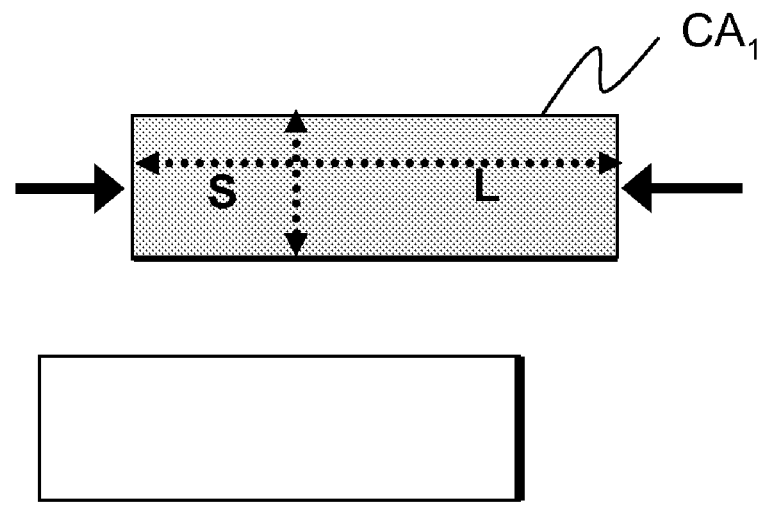
FIGS. 3a and 3b are other examples of circuit optimization using common run objectives within structures.
Figure 3B:
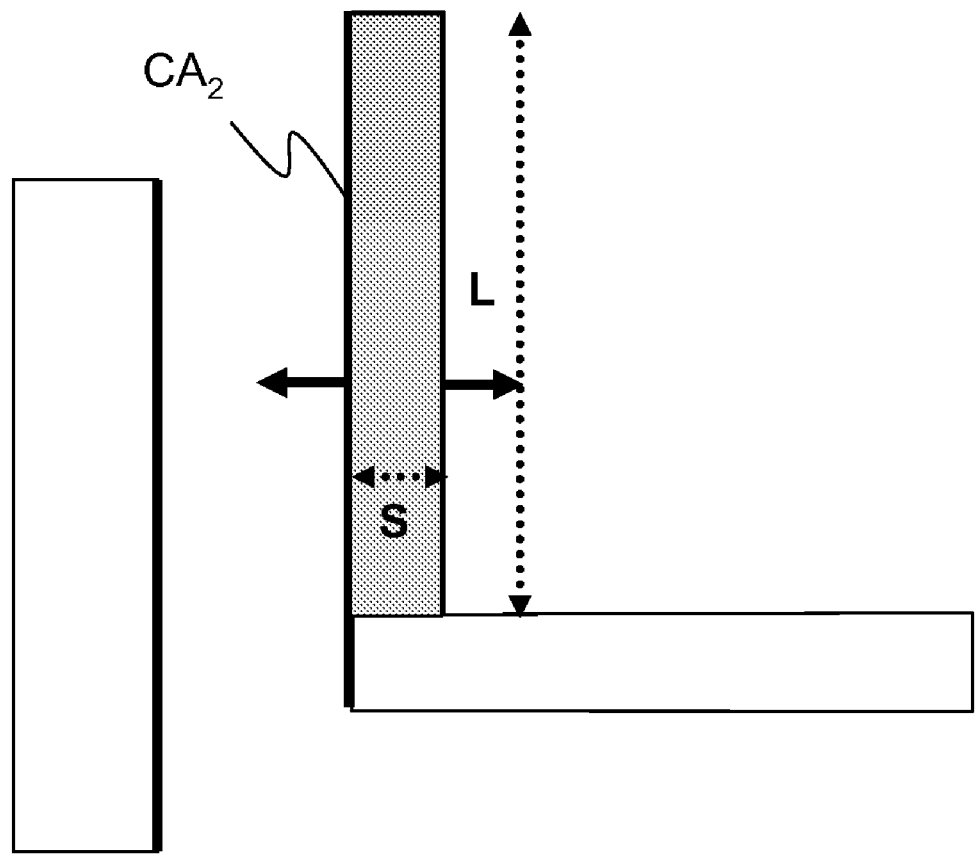

FIG. 3 shows another example of changing shape geometries to reduce common run. FIG. 3a illustrates an optimization of $CA_1$ by reducing the length L to reduce the probability of an open fault. FIG. 3b illustrates an optimization of $CA_2$ by increasing S to reduce the probability of a open fault.

The weights assigned to critical area based on L/S from step 106, which is a first-order approximation to the critical area contribution of the edges, allows the method to make trade-offs in edge positions and use available white space in a way that has the most beneficial effect on yield by reducing critical area. These trade-offs are made automatically as a consequence of the mathematical optimization that is performed by the method.

In step 114, the method measures the critical area of the resulting layout from step 112 using any method of measuring critical area (i.e. not limited to the measurements used for the optimization step herein). For example, Monte Carlo, Voronoi, geometric expansion, etc.

In step 116, the method compares the critical area measurement of step 114 with the critical area measurement of step 102 (for the first iteration) or of step 114 of the previous iteration (for iterations other than the first) and determines whether the critical area has been reduced sufficiently to improve the yield prediction value. If no, the method ends without saving the modified layout. If yes, the results and the modified layout are saved, as shown in step 118. The method then returns to step 104 and either repeats the scan for the same layer, scans a different layer, or scans in a different direction, e.g. scanning in a direction perpendicular to the first direction.

Below is an example of an algorithm that could be used to perform an optimization method for shorts, according to the present invention. The algorithm may be repeated for each metal level in a design. The example is shown as pseudocode.

Figure 4:
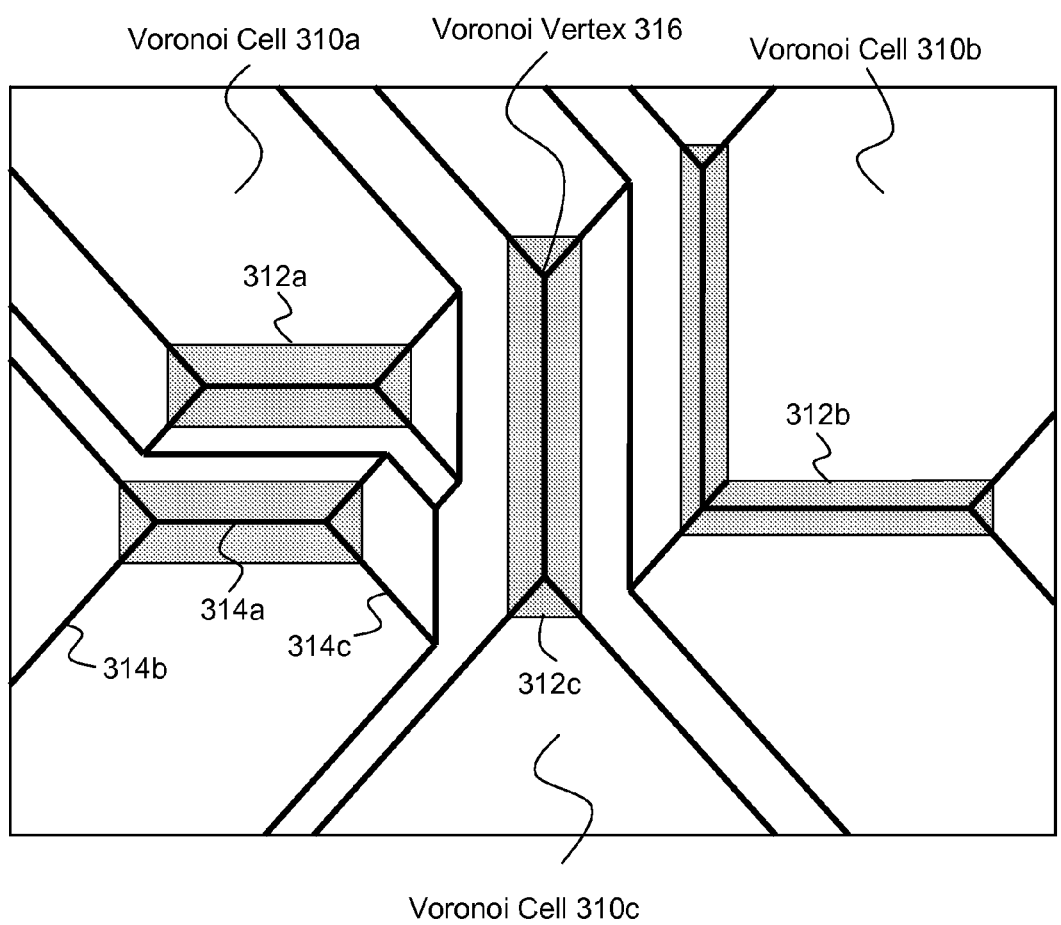
FIG. 4 is an example Voronoi diagram and a sample circuit layout.

Assign variables to all vertical edges of shapes on layer metal_1.
Using a scanline program with a horizontal scanline, do the following: p1 For each pair of facing vertical unioned edges e_i and e_j on metal_1 (as in FIG. 2b)
let x_i and x_j be the variables assigned to the two edges e_i and e_j respectively, where e_j is the edge having the larger starting x coordinate value
measure the distance S between the edges
measure the common run L of the two edges add the objective function alpha*(K_s_1)*(x_j−x_i), where alpha=L/S and K_s is the constant representing the weight given to shorting defects on metal_1 add the constraint functions abs(x_i−x_i*)<=d and abs (x_j−x_j*)<=d, where x_i* is the starting position of the edge e_i;

x_j* is the starting position of edge e_j, and d is a constant that is some small multiple of the base manufacturing grid For each convex corner formed by unioned edges on metal_1 let e_i be the vertical edge forming the convex corner let e_j be a vertical edge forming another convex corner such that two facing horizontal edges result (as in FIG. 2a)

let x_i and x_j be the variables assigned to the two edges e_i and e_j respectively, where e_j is the edge having the larger starting y coordinate measure the distance S between the edges measure the common run L of the two edges add the objective function alpha*(K_s_1)*(x_j−x_i), where alpha=L/S and K_s is the constant representing the weight given to shorting defects on metal_1 add the constraint functions abs(x_i−x_i*)<=d and abs (x_j−x_j*)<=d, where x_i* is the starting position of the edge e_i; x_j* is the starting position of edge e_j, and d is a constant that is some small multiple of the base manufacturing grid In a second embodiment of the present invention, the method of identifying critical area in a VLSI design uses Voronoi diagrams, an example of which is shown in FIG. 4. A Voronoi diagram is used to enhance the computation of critical area. A Voronoi diagram of a set of 2D geometric elements (polygons, line segments, points) is a partition of the plane into regions representing those points in the plane closest to a particular geometric element. Here, closest is defined in terms of an appropriate geometry to represent a defect. These regions are called Voronoi cells 310, each of which is associated with its defining geometric element 312, called the owner of the cell. The set of points which separates two Voronoi cells is called a Voronoi bisector 314. The point where three or more Voronoi bisectors 314 (or Voronoi cells 310) meet is called a Voronoi vertex 316.

Based on the circuit design and under an appropriate geometry, Voronoi diagrams can be constructed to model the effect of extra-material and missing-material spot defects. The Voronoi diagram partitions the circuit design into Voronoi cells within which defects that occur cause electrical faults between the same two shape edges in the design. This information can then be used to compute critical area. (e.g., see U.S. Pat. Nos. 6,317,859, 6,247,853, and 6,178,539). The foregoing is a method of the present invention for using Voronoi diagrams to identify critical areas and is shown in FIG. 5.

Figure 5:
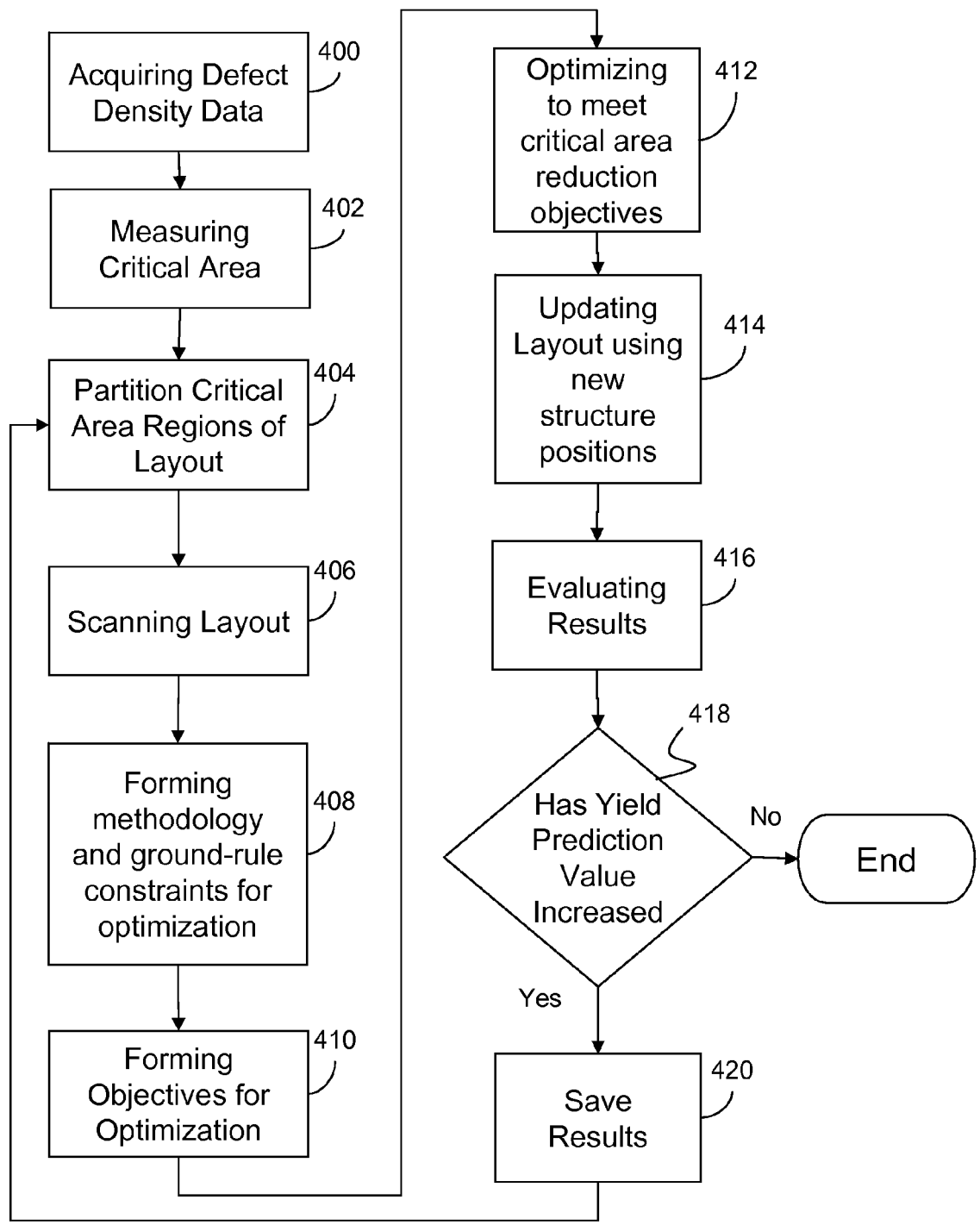
FIG. 5 is a flow diagram of a circuit optimization method using Voronoi diagrams.

In step 400 of FIG. 5, the method acquires defect density data from manufacturing. This data includes information regarding the incidence of random-defect yield problems for a given technology in the manufacturing line.

In step 402, the method measures critical area. According to the defect density data acquired in step 400, the method identifies critical area in the design. In step 404, the method creates a Voronoi diagram, which partitions the layout into disjoint critical area regions. A pair of layout edges is then identified for each of these regions. This identification reveals which pairs of edges in the layout can interact to produce a random-defect open (when the edges in the same unioned shape) or a random-defect short (when the edges are in different unioned shapes).

Figure 6A:
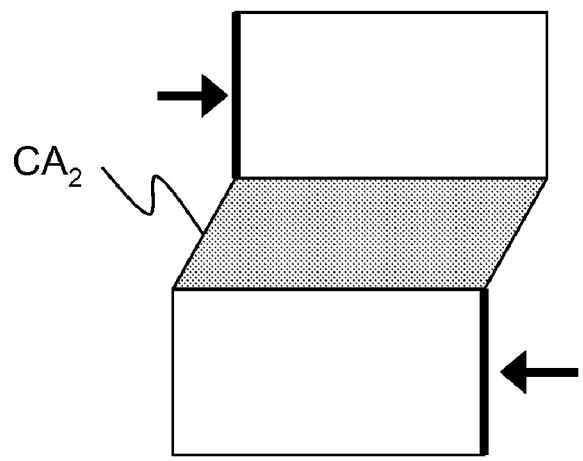
FIGS. 6a and 6b are examples of circuit optimization using critical area reduction objectives.

In step 406 the method scans the layout in which the critical area regions are mapped and calculates the critical areas with the higher probability of failures (depending on a threshold of failure tolerance). The weight assigned to each of these critical areas is the product of the Voronoi cell characteristics and a layer-specific constant for shorts, opens, random defects, or combinations of faults, depending on whether the method is manipulating edges in the same unioned shape (e.g. to treat opens) or in two different unioned shapes (e.g. to treat shorts). These fault constants represent the relative incidence of faults in that layer, for the type of defect in question, in the manufacturing line. FIG. 6a shows an example of a critical area region susceptible to a defect that may cause a short.

In step 408 the method forms the methodology and ground rule constraints for optimization. The ground rule constraints include limitations on the degree of changes that can be made to a layout shape and/or its location to ensure that the resulting optimized design meets design-methodology constraints, timing and logic requirements, and manufacturability requirements. The optimization must stay within the boundaries defined in this step.

Figure 6B:
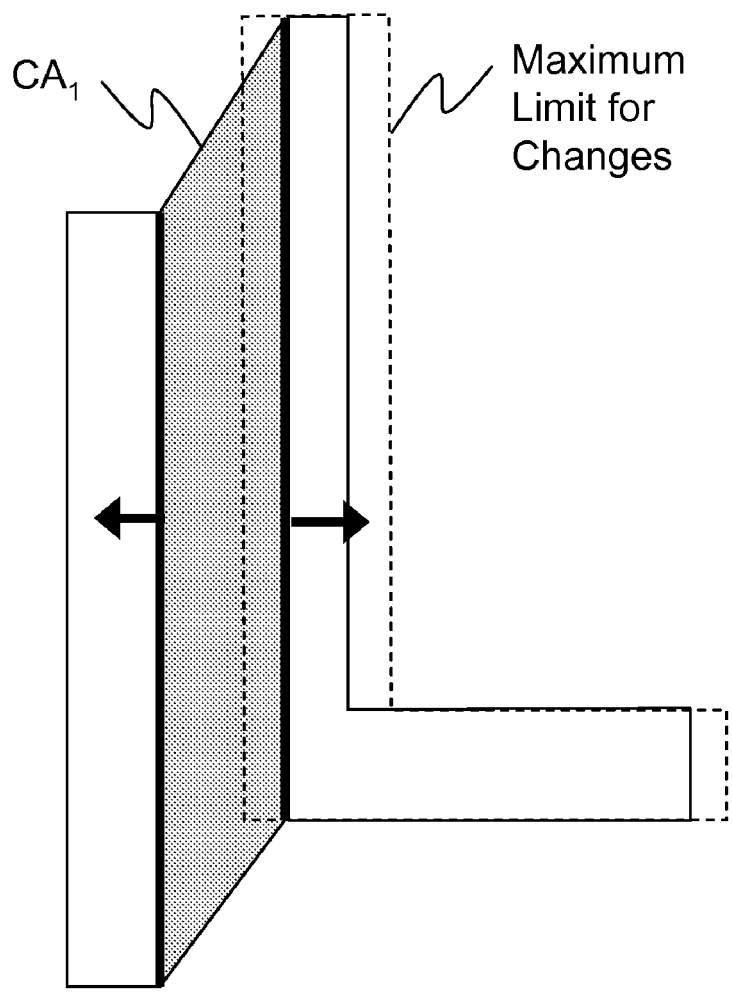

In step 410 the method forms piecewise linear objectives for optimization according to the critical-area weights assigned in step 406. These objectives, along with the constraints defined in step 408, comprise the overall design optimization constraints. An example of a maximum limit for changes is shown as a dotted area in FIG. 6b. In FIG. 6b, the two shapes cannot be moved to a point at which the new configuration fails to meet a specific timing requirement (i.e. outside of the dotted boundary). Likewise, the optimization objectives may be defined in terms of a fixed reference point, such as the point x=0, y=0, within the design. For example, the method creates objectives that restrict the movement of a shape relative to this fixed referent point, as shown in FIG. 6b.

In step 412, the method performs optimization on the layout design in order to reduce critical area within the layout. The optimization comprises changing shapes and moving the locations of shapes within the layout and conforming to the predetermined constraints. For example, the method identifies a pair of parallel Voronoi edges and moves the edges closer together, as shown in FIG. 6a, to reduce the probability of a short, or move the edges farther apart as shown in FIG. 6b. The result is a reduction of the failure probabilities of critical areas $CA_1$ and $CA_2$.

In step 414, the method updates the layout to reflect the changes identified in step 412 thus creating a new layout.

In step 416, the critical area is computed for the new layout. Based on the new critical area computation, the method computes a new yield prediction value. An example critical area computation formula is described in detail in U.S. Pat. No. 6,178,539 EQ. 2 as follows:

$$A_c = \int_0^{+\infty} A(r) D(r) dr$$

Where $A_c$ is the critical area value, $A(r)$ is the area of the set of points with the property that a defect of radius r whose center falls in this set causes a fault, and $D(r)$ is the defect distribution function (i.e., the probability that a defect of radius r will appear in the layout). However, as one skilled in the art will appreciate, the computation may be performed by any other reasonable technique or formula.

In step 418, the method compares the new yield prediction value with the previous yield prediction value to determine whether the new layout has reduced critical area; if yes, the method saves the new layout design (step 420) and returns to step 404, if no, the method exits without saving the new layout.

Figure 7A:
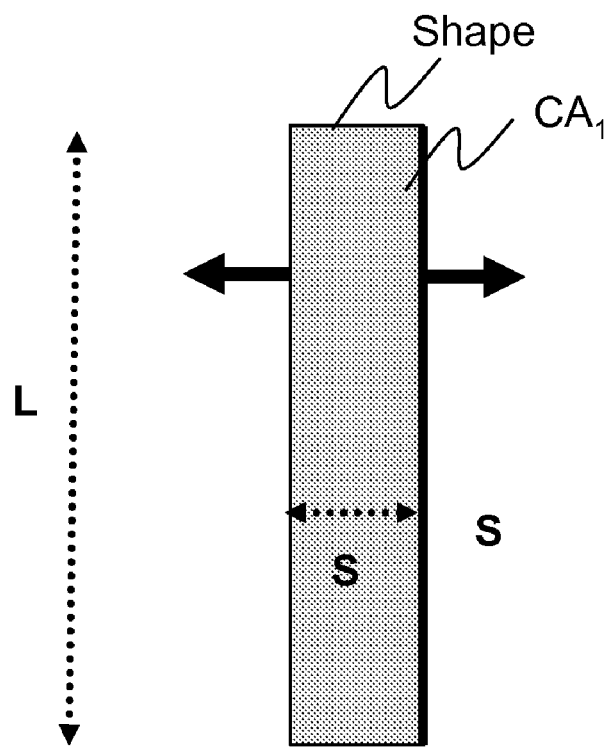
FIGS. 7a and 7b show examples of reducing the critical area for a open-circuit fault using the methods described herein.
Figure 7B:
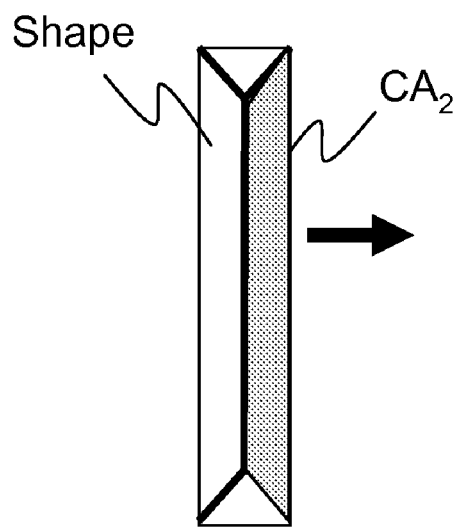

FIG. 7 shows an example of how each method alleviates the fault probabilities for open-faults. FIG. 7a shows the critical area reduction of an open-fault by increasing S and keeping L constant. Likewise, FIG. 7b shows the increased area of the shape, which reduces the probability of an open-fault on that structure.

Figure 8A:
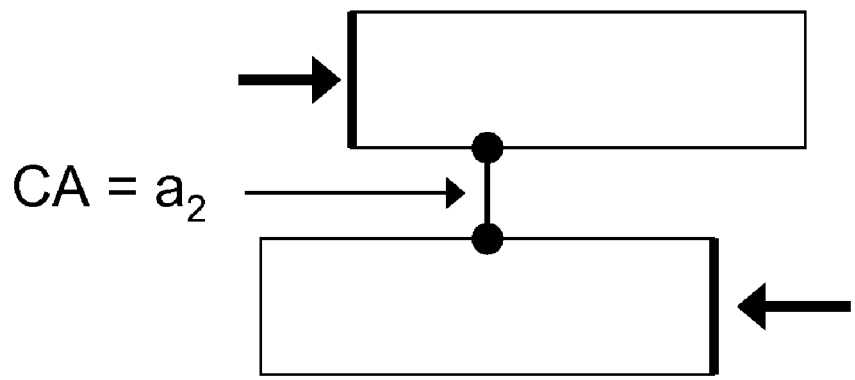
FIGS. 8a and 8b show examples of circuit optimization using a critical area value between structures.
Figure 8B:
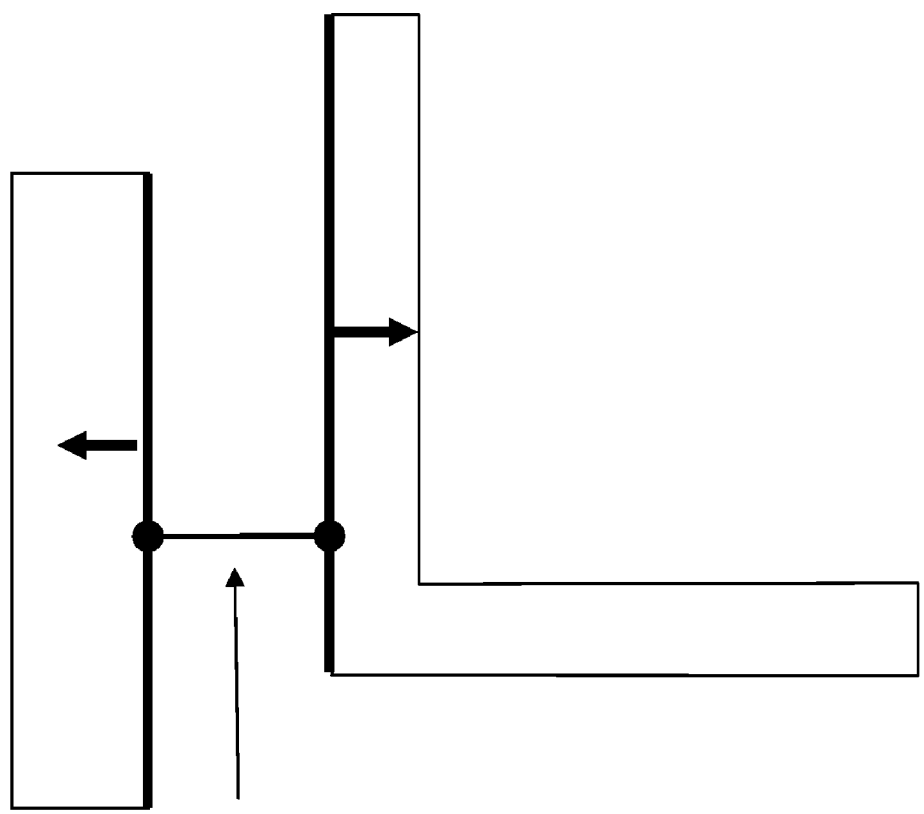
Figure 9A:
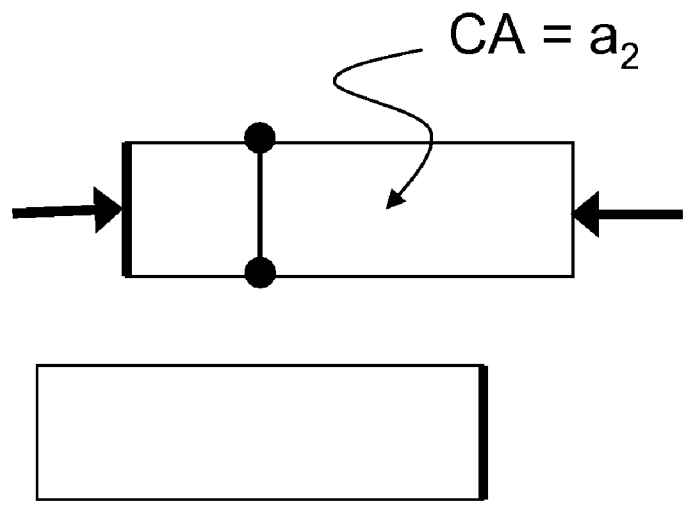
FIGS. 9a and 9b show examples of circuit optimization using a critical area value within structures.
Figure 9B:
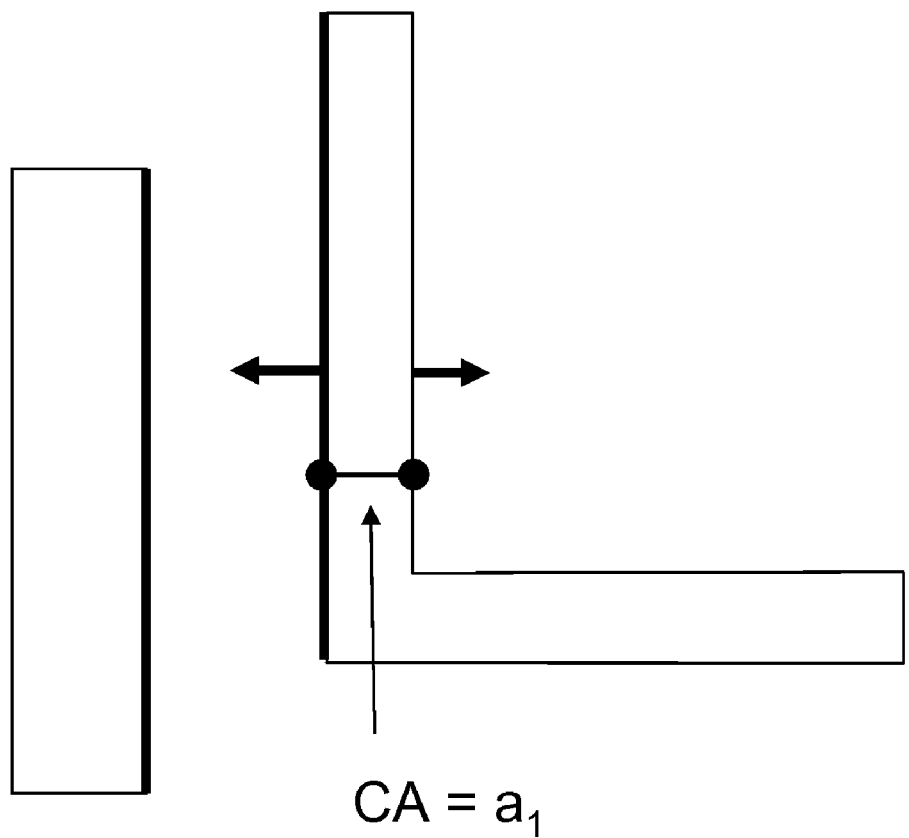

FIGS. 8 and 9 represent an example of a third embodiment of the present invention. The third embodiment uses a general critical area analysis tool that computes geographical areas with corresponding critical area numbers for those areas, such that the areas can be identified with original edges in the layout. FIG. 8a shows a critical area value $a_2$ between two shapes and the corresponding optimization direction. Similarly, FIG. 8b shows another example of a corresponding critical area number $a_1$ and an optimization direction for moving the shapes to reduce the probability of a short. FIGS. 9a and 9b show an example of critical area numbers corresponding to opens within individual shapes and the corresponding optimization direction for each.

Figure 10:
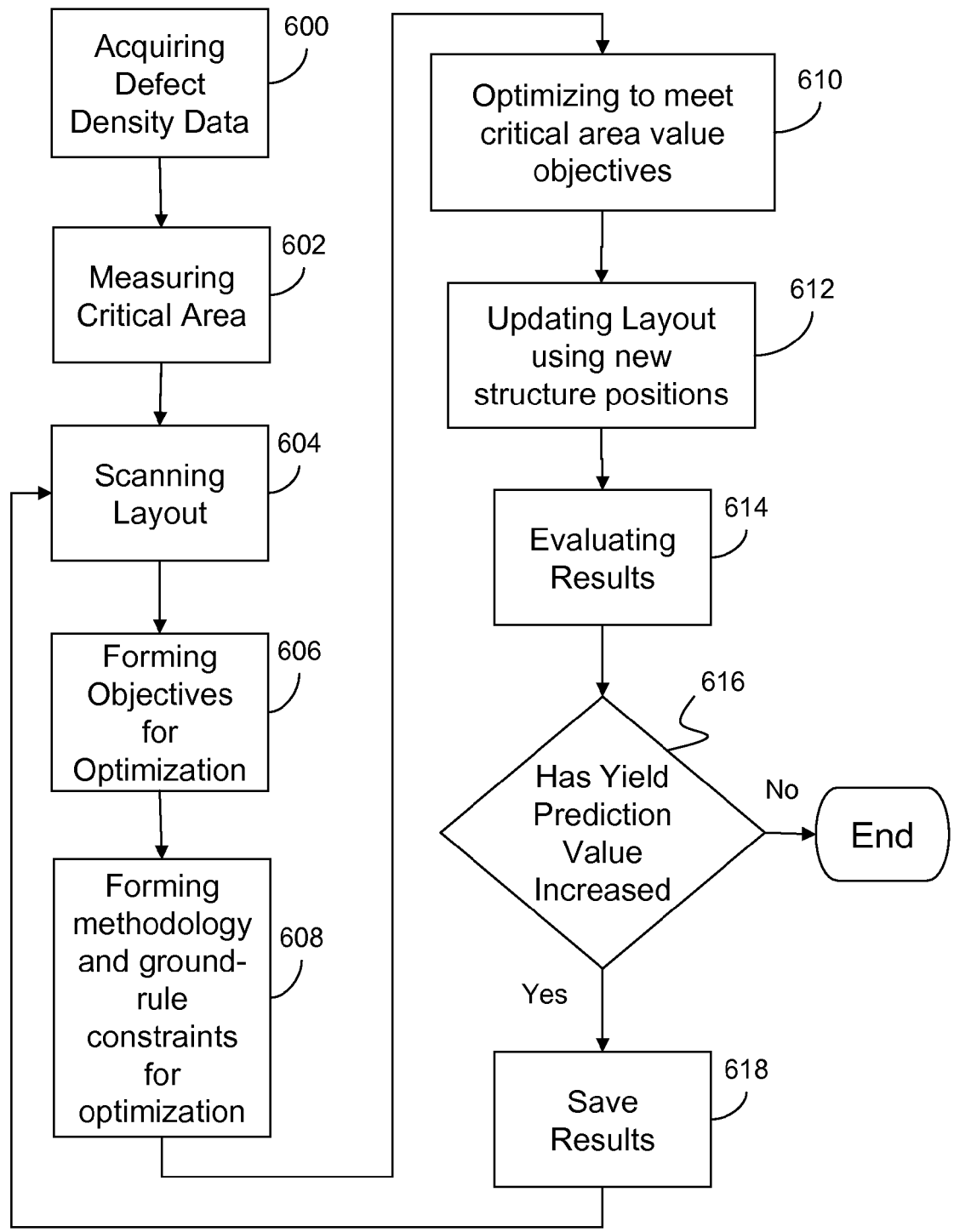
FIG. 10 is a flow diagram of a circuit optimization method using critical area values derived from a non-Voronoi-diagram CAA of the layout.

FIG. 10 illustrates the method of the third embodiment, which identifies critical area in an IC layout using geographical area information and associated critical area values to those locations. In step 600, the method acquires defect density data provided by the manufacturing process. This data gives the estimated fault density for various defect mechanisms (e.g., short-circuit-causing faults on layer M1) and provides the input for step 602. In step 602 the method measures critical area based on the defect data.

In step 604, for a given layout, the method scans the layout and records critical area values for each geographical area in the design. The method compares the recorded information to the defect density data to identify and map critical areas.

In step 606, the method builds a set of pair-wise objectives in one direction (e.g. vertically, horizontally) called the optimization direction, within the critical areas identified in step 604. For each critical area value, the method builds a piecewise linear objective that attempts to move the geometries apart or reduce the distance between the geometries as shown in FIGS. 8 and 9. The method also assigns a weight to the objectives based on the layer being evaluated and whether the geometries in question are in the same unioned shape (i.e. for opens) or are in a different unioned shapes (i.e. for shorts).

In step 608, the method forms methodology and ground rule constraints for optimization. The method places limits on how far apart the geographic locations for each shape can be moved based on ground rules, topological constraints, and electrical and logic requirements of the underlying circuit.

In step 610, the method optimizes the design to meet critical area value objectives identified in step 606. For example, modifying the geometry or shape of a structure to reduce its critical area for opens can be accomplished either by making it shorter or wider. Modifying the geometry of two different structures to reduce their critical area for shorts can be accomplished by moving them farther apart or by reducing their common run.

In step 612, the method modifies the placement and/or shapes of the design according to the optimization results from step 610, updating the layout using the new structure positions. The amount the geographic areas are expanded or contracted is a small value, e.g. a few steps in the manufacturing grid. By restricting the change of any one geometry to a small amount in any optimization step, the method allows new relationships caused by the relative movement of geometries to be discovered and optimized during the next subsequent optimization run.

In step 614, the method measures the critical area of the resulting layout from step 612 using any method of measuring critical area (i.e. not limited to the measurements used for the optimization step herein). For example, Monte Carlo, Voronoi, geometric expansion, etc.

In step 616, the method compares the critical area measurement of step 614 with the critical area measurement of step 602 in the first iteration or the results in step 614 from the previous iteration for iterations other than the first and determines whether the critical area has been reduced sufficiently to improve the yield prediction value. If no, the method ends without saving the modified layout. If yes, the results and the modified layout are saved, as shown in step 618. The method then returns to step 604 and either repeats the scan for the same layer, scans a different layer, or scans in a different direction, e.g. scanning in a direction perpendicular to the first direction.

Figure 11:
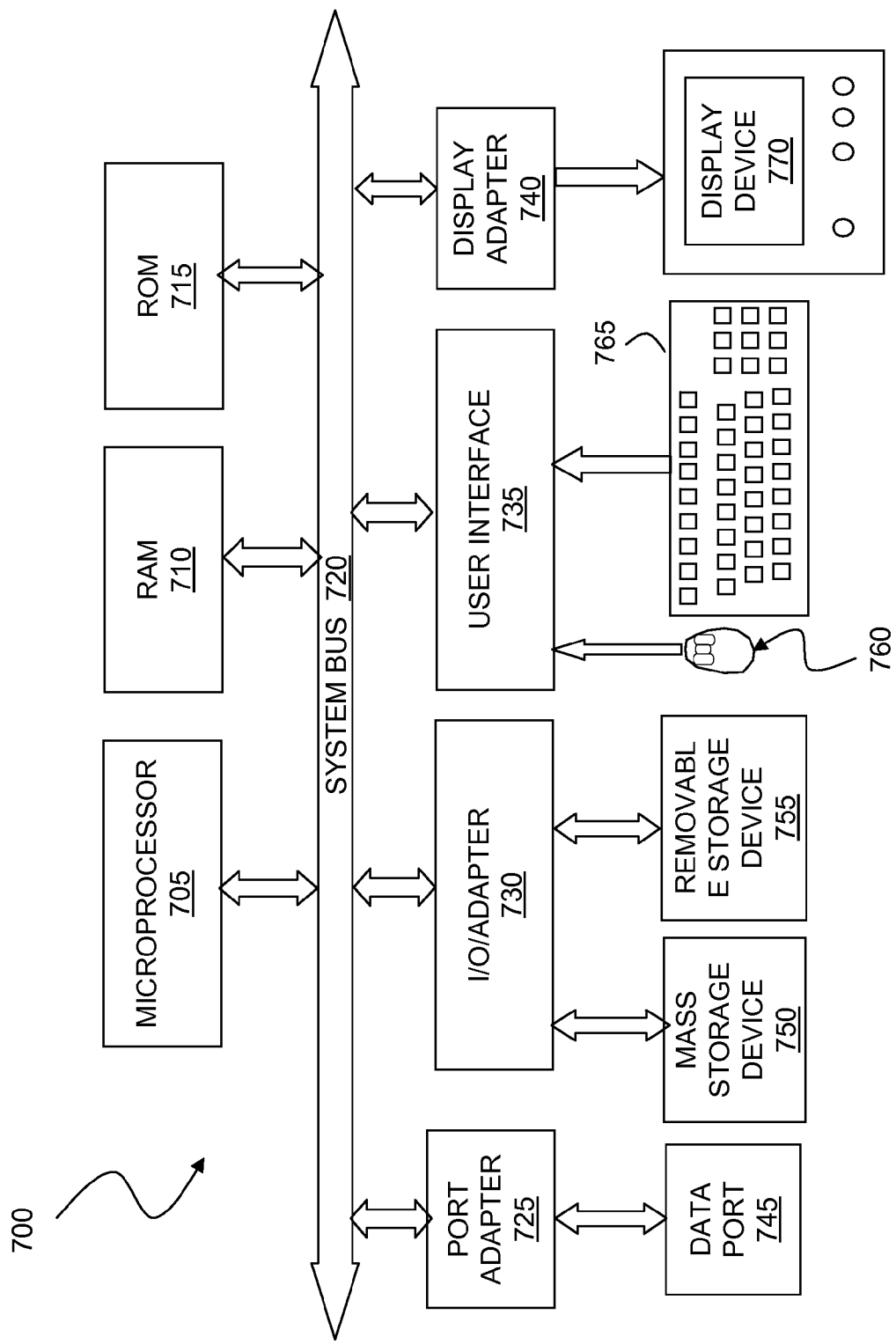
FIG. 11 is a block diagram of a computer system on which the present invention operates.

Generally, the method described herein is practiced with a general-purpose computer and the method may be coded as a set of instructions on removable or hard media for use by the general-purpose computer. FIG. 11 is a schematic block diagram of a general-purpose computer for practicing the present invention. FIG. 11 shows a computer system 700, which has at least one microprocessor or central processing unit (CPU) 705. CPU 705 is interconnected via a system bus 720 to a random access memory (RAM) 710, a read-only memory (ROM) 715, an input/output (I/O) adapter 730 for connecting a removable and/or program storage device 755 and a mass data and/or program storage device 750, a user interface 735 for connecting a keyboard 765 and a mouse 760, a port adapter 725 for connecting a data port 745 and a display adapter 740 for connecting a display device 770. ROM 715 contains the basic operating system for computer system 700. Examples of removable data and/or program storage device 755 include magnetic media such as floppy drives, tape drives, portable flash drives, zip drives, and optical media such as CD ROM or DVD drives. Examples of mass data and/or program storage device 750 include hard disk drives and non-volatile memory such as flash memory. In addition to keyboard 765 and mouse 760, other user input devices such as trackballs, writing tablets, pressure pads, microphones, light pens and position-sensing screen displays may be connected to user interface 735. Examples of display device 770 include cathode-ray tubes (CRT) and liquid crystal displays (LCD).

A computer program may be created by one of skill in the art and stored in computer system 700 or a data and/or removable program storage device 765 to simplify the practicing of this invention. In operation, information for the computer program created to run the present invention is loaded on the appropriate removable data and/or program storage device 755, fed through data port 745 or entered using keyboard 765. A user controls the program by manipulating functions performed by the computer program and providing other data inputs via any of the above mentioned data input means. Display device 770 provides a means for the user to accurately control the computer program and perform the desired tasks described herein.

The process of optimizing a layout design as described herein, may be performed as a service to a customer. As a service, the customer provides a circuit layout to a circuit manufacturer. The circuit manufacturer then uses current manufacturing data along with one or more of the analysis methods described herein, such as Voronoi, common run, Monte Carlo, or critical area values, for example, and performs optimization by changing the geometric dimensions and/or locations of the shapes that are encompassed by the layout design. The resulting layout has less critical area and thus has a higher yield potential than the original circuit layout designed by the customer. The manufacturer uses the improved circuit design to manufacture the customer's integrated circuits. The circuits that are produced have a higher yield so that fewer lots are required to be manufactured to meet the customer's needs. The customer saves money because of the higher yield, which resulted from the design optimization techniques embodied in this invention. In addition, the manufacturer has more capacity due to fewer lots and can use the extra capacity to increase manufacturing revenue.

The above description and drawings are only to be considered illustrative of exemplary embodiments, which achieve the features and advantages of the invention. It should be appreciated by one of ordinary skill in the art that modification and substitutions to specific layout designs, systems for performing critical area analysis and optimization, methods of analyzing critical area, and the geometries of the structures can be made without departing from the spirit and scope of the invention. Accordingly, the invention is not to be considered as being limited by the foregoing description and drawings.

What is claimed is:

1. A computer-implemented service for improving integrated circuit manufacturing yield comprising:
   providing, by a computing device, a customer IC design layout having at least one structure;
   providing, by said computing device, manufacturing data;
   analyzing, by said computing device, the layout according to the data;
   identifying, by said computing device, at least one critical area;
   creating, by said computing device, optimization objectives that restrict movement of a shape of said at least one critical area relative to a fixed reference point;
   performing, by said computing device, changes to one or more geometries of the structure within said at least one critical area to create a second layout;
   analyzing, by said computing device, the second layout according to the data;
   accepting, by said computing device, the second layout if the second layout is characterized by reducing said at least one critical area.

2. The computer-implemented service of claim 1, wherein the changes comprise a change in at least one dimension of the geometry of the structure.

3. The computer-implemented service of claim 1, wherein the changes comprise a change in at least one critical area value associated with the structure.

4. The computer-implemented service of claim 1, wherein the changes comprise moving at least one edge of the structure.

5. The computer-implemented service of claim 1, wherein the changes comprise moving a geographical location of the structure to a second location relative to the layout.

6. The computer-implemented service of claim 1, wherein at least one integrated circuit is manufactured from the second layout.

7. The computer-implemented service of claim 1, where said analyzing said layout according to said manufacturing data further comprises:
   recording a common run between adjacent parallel edges;
   recording a distance between said adjacent parallel edges;
   calculating, by said computing device, a product of: a ratio between said common run and said distance, and said manufacturing data including a layer-specific defect constant for one of shorts, opens, random defects and combinations of defects; and
   assigning, by said computing device, weights to each of a plurality of critical areas based on said calculating said product.

8. The computer-implemented service of claim 7, where said assigning weights further comprises:
   determining, by said computing device, whether said adjacent parallel edges are in the same unioned shape, to treat opens, or said adjacent parallel edges are in two different unioned shapes, to treat shorts.

9. The computer-implemented service of claim 1, where said creating said optimization objectives comprise:
   building, by said computing device, a set of piecewise-linear pair-wise objectives in one of a vertical optimization direction and a horizontal optimization direction within said at least one critical area; and
   building, by said computing device, a linear objective that attempts to one of move said parallel edges apart, for parallel edges perpendicular to either optimization direction, and reduce a distance over which said parallel edges face each other, for parallel edges parallel to either optimization direction.

10. The computer-implemented service of claim 9, further comprising:
    assigning, by said computing device, a weight to said linear objective based said parallel edges being one of a same unioned shape, for opens, and a different unioned shape for shorts.

11. The computer-implemented service of claim 1, where said creating said optimization objectives further comprise:
    constraining, by said computing device, dimension of how far apart or how close together parallel edges for each shape can be moved; and
    constraining, by said computing device, dimensions that certain shapes can tolerate based on ground rules and topological parameters.

12. The computer-implemented service of claim 11, further comprising:
    reducing opens in said at least one critical area by making a rectangular shape of said at least one critical area one of shorter or wider, based on said constraining said dimensions of how far apart or how close together parallel edges for each shape can be moved, and said constraining dimensions that certain shapes can tolerate based on ground rules and topological parameters.

13. The computer-implemented service of claim 11, further comprising:
    reducing the shorts in said at least one critical area between two facing vertical edges of different critical area shapes by one of reducing a common run, and moving the parallel edges further apart.

14. The computer-implemented service of claim 1, where said second layout creation further comprises:
    moving, by said computing device, said parallel edges a small amount of steps in a manufacturing grid; and
    discovering, by said computing device, new relationships between structures caused by said moving said parallel edges in said second layout.

15. A computer-implemented service for improving integrated circuit manufacturing yield comprising:
    providing, by a computing device, a customer IC design layout having at least one structure;
    providing, by said computing device, manufacturing data;
    analyzing, by said computing device, the layout according to the data;

identifying, by said computing device, at least one critical area;

creating, by said computing device, optimization objectives by building a set of piecewise-linear pair-wise objectives in one of a vertical optimization direction and a horizontal optimization direction within said at least one critical area, and building a linear objective that attempts to one of move said parallel edges apart, for parallel edges perpendicular to either optimization direction, and reduce a distance over which said parallel edges face each other, for parallel edges parallel to either optimization direction, where said optimization objectives restrict movement of a shape of said at least one critical area relative to a fixed reference point;

performing, by said computing device, changes to one or more geometries of the structure within said at least one critical area to create a second layout;

analyzing, by said computing device, the second layout according to the data;

accepting, by said computing device, the second layout if the second layout is characterized by reducing said at least one critical area.

16. The computer-implemented service of claim 15, where said analyzing said layout according to said manufacturing data further comprises:

recording a common run between adjacent parallel edges;

recording a distance between said adjacent parallel edges;

calculating, by said computing device, a product of: a ratio between said common run and said distance, and said manufacturing data including a layer-specific defect constant for one of shorts, opens, random defects and combinations of defects; and assigning, by said computing device, weights to each of a plurality of critical areas based on said calculating said product.

17. The computer-implemented service of claim 15, further comprising:

assigning, by said computing device, a weight to said linear objective based said parallel edges being one of a same unioned shape, for opens, and a different unioned shape for shorts.

18. The computer-implemented service of claim 15, where said creating said optimization objectives further comprise:

constraining, by said computing device, dimension of how far apart or how close together parallel edges for each shape can be moved; and constraining, by said computing device, dimensions that certain shapes can tolerate based on ground rules and topological parameters.

19. The computer-implemented service of claim 18, further comprising:

reducing opens in said at least one critical area by making a rectangular shape of said at least one critical area one of shorter or wider, based on said constraining said dimensions of how far apart or how close together parallel edges for each shape can be moved, and said constraining dimensions that certain shapes can tolerate based on ground rules and topological parameters.

20. The computer-implemented service of claim 18, further comprising:

reducing the shorts in said at least one critical area between two facing vertical edges of different critical area shapes by one of reducing a common run, and moving the parallel edges further apart.

* * * * *